United States Patent [19]

Hashemian et al.

[11] 4,295,128
[45] Oct. 13, 1981

[54] APPARATUS FOR MEASURING THE DEGRADATION OF A SENSOR TIME CONSTANT

[75] Inventors: Hashem M. Hashemian, Knoxville; Thomas W. Kerlin, Concord; Belle R. Upadhyaya, Knoxville, all of Tenn.

[73] Assignee: University of Tennessee Research Corp., Knoxville, Tenn.

[21] Appl. No.: 23,641

[22] Filed: Mar. 26, 1979

[51] Int. Cl.³ ............................................. G08B 27/00
[52] U.S. Cl. .................................... 340/506; 340/658; 324/78 D
[58] Field of Search ............... 340/506, 512, 514, 654, 340/659; 324/78 D, 78 F, 78 Z, 79 D; 328/140; 235/92 TF, 92 FQ, 92 CA; 364/484

[56] References Cited

U.S. PATENT DOCUMENTS

| 2,756,409 | 7/1956 | Lubkin | 340/659 |
|---|---|---|---|
| 2,978,642 | 4/1961 | Papineal | 328/140 |
| 2,992,384 | 7/1961 | Malbrain | 324/79 D |
| 3,491,305 | 1/1970 | Stone | 328/140 |
| 3,805,171 | 4/1974 | Drumheller | 328/140 |
| 3,922,670 | 11/1975 | Shaw et al. | 235/92 TF |
| 3,924,183 | 12/1975 | Fletcher et al. | 324/79 D |
| 3,990,007 | 11/1976 | Hohhof | 324/78 D |
| 3,993,984 | 11/1976 | Penrod | 329/78 D |
| 4,165,458 | 8/1979 | Koizumi et al. | 235/92 TF |

Primary Examiner—Gerald L. Brigance
Attorney, Agent, or Firm—Pitts & Kesterson

[57] ABSTRACT

Methods and apparatus for on-line detection and measurement of degradation or undesirable changes in the time constants of sensors used in monitoring a system are disclosed. Methods and apparatus of this invention are particularly suitable for use in complex and high-risk industrial processes or other operations where it is undesirable and expensive or dangerous to allow certain parameters of the operation to change above or beyond a predetermined amount. This invention includes a detector for determining when a signal from a sensor crosses a preselected signal level such as for example a zero level. The output of the detector or zero crossing detector is provided to a counter or other means which determines the rate of the zero crossing by counting the number of crossings per a specific time period provided by a timer. The determined rate of the zero crossing is then compared to a preselected acceptable rate to determine whether or not the sensor time constant has increased beyond the preselected allowable value. If the detected crossing rate is less than the acceptable value, (corresponding to a time constant above its acceptable value) an alarm will be sounded to alert the operator of the system of the degraded sensor response time.

21 Claims, 7 Drawing Figures

APPARATUS FOR MEASURING THE DEGRADATION OF A SENSOR TIME CONSTANT

BACKGROUND OF THE INVENTION

This invention relates to the continuous surveillance of sensors used for monitoring changes in the various parameters of a system. More particularly, the invention provides a method and apparatus for on-line detection of degradation or undesirable changes in the time constants of sensors used in monitoring the flow rate, temperature, pressure, level, radiation, etc., of a system.

Heretofore, evaluation and calibration of sensors used in monitoring a process or system, typically took place during periodic maintenance or when the system was completely shut down. However, as industrial processes have become more continuous and complex, it is often undesirable and very expensive to shut down an industrial process as often as would be necessary to provide adequate periodic calibration and evaluation of the sensors monitoring the process. In addition, some industrial processes and systems operations, including nuclear power plant operations, represent such potential danger that any degradation or reduced performance of sensors used in monitoring the process or system could be critical. Therefore, it is of great importance that any such degradation be brought to the attention of the person responsible for the systems opration.

The use of fluctuating output signals to obtain information about the dynamic characteristics of a system or process in itself is not new. For example, refer to "Random Data: Analysis and Measurement Procedures" by J. S. Bendat and A. G. Piersol which was published by John Wiley and Sons, Inc., New York, 1971; and "Random Noise Techniques in Nuclear Reactor Systems" by R. E. Uhrig which was published by the Ronald Press company, New York, 1970. Typically, these available methods as discussed in the above references include evaluation of spectral densities or time series models. According to these methods, however, it is necessary to perform extensive calculations on the raw data to obtain the desired results. In addition, methods have been devised which continually monitor and use the statistical properties of a sensor output to detect degradation. A discussion of some of the methods may be found in "Two On-Line Methods for Routine Testing of *Neutron and Temperature Estimates of Power Reactors*" by M. Eldemann, a Kernforschungszentrum Karlsruhe Report, KFK, 2316, July, 1976 Karlsruhe, Germany; and "In-Situ Response Time Testing of Platinum Resistance Thermometers" by T. W. Kerlin et al. a EPRI Report, NP-459, January, 1977, Palo Alto, Calif. Unfortunately, as was mentioned above, the presently available methods and apparatus are typically very complex and expensive and require such extensive calculation on the raw data that a computer is usually necessary for implementation. However, the previous methods and techniques were more powerful than necessary for simply monitoring the sensor response characteristics. Therefore, as will become clear hereinafter, the zero crossing method used in the sensor response time degradation monitor of this invention uses a technique which is, therefore, less demanding than the presently available methods and techniques which require a detailed computer analysis.

SUMMARY OF THE INVENTION

Therefore, it is an object of the present invention to provide a simple and inexpensive method and apparatus for monitoring the degradation of a sensor used in monitoring a process or system.

It is another object of the invention to provide a method and apparatus for monitoring the performance of a sensor used in a process or system while it is functioning or operating in the system.

It is still another object of the invention to provide a simple and inexpensive method and apparatus for monitoring a system while it is on-line.

These and other objects are achieved by the methods and apparatus of the present invention which provides for evaluating changes in the response time of a sensor, used to monitor changes in a selected system parameter. According to this invention, a signal generated by the sensor being evaluated and normally used to indicate the changes in a selected system parameter is received by circuitry for monitoring when the value of the sensor signal crosses a selected signal level such as for example the level predetermined to be the average level. Also included, is circuitry for determining the number of times that the sensor signal crosses the selected level during a selected time period such that a crossing rate may be obtained. The crossing rate obtained is then compared with a nominal crossing rate to determine whether a change has taken place in the response time of the monitored sensor. For example, the crossing rate is compared with a preselected acceptable rate such that when the determined crossing rate does not achieve the preselected acceptable rate a warning or alarm will be provided to the operator of the system.

The above mentioned objects as well as other objects will be more clearly understood by reference to the detailed description of this invention and the drawings wherein:

DESCRIPTION OF THE INVENTION

Figure 1:
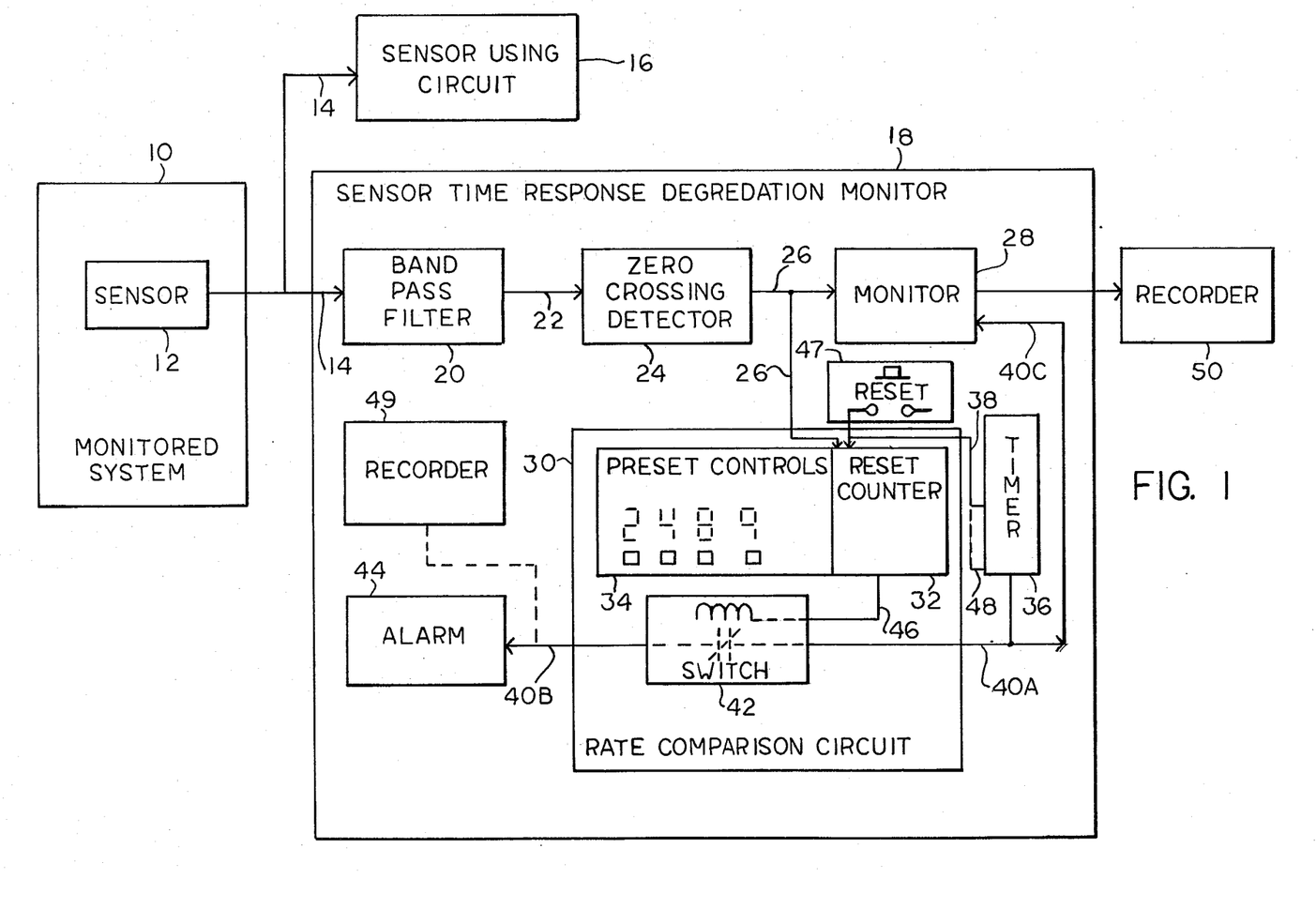
FIG. 1 is a block diagram of a sensor response time degradation monitor incorporating the features of this invention.
Figure 3:
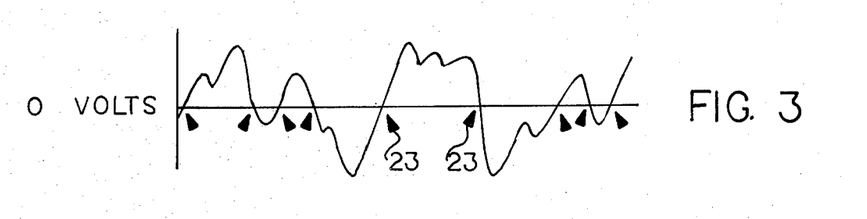
FIG. 3 is a graph illustrating the actual fluctuations of a system or process parameter.
Figure 4:
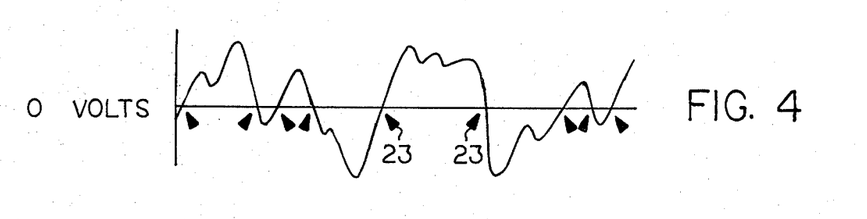
FIG. 4 is a graph illustrating the fluctuations of a system or process parameter of FIG. 2 as sensed by a theoretical sensor having a zero time constant.

Referring now to FIG. 1 there is shown a block diagram of a Sensor Response Time Degradation Monitor incorporating the features of this invention. As is shown, system or process 10 is of a type having various parameters that are monitored by a sensor 12. It will be appreciated that most processes or systems will include many parameters which need such monitoring, but for purposes of explanation a single sensor is shown. For example, sensor 12 could be a sensor suitable for monitoring such conditions as flow rate, temperature, pressure, radiation, etc. It will become clear hereinafter, that the degradation monitor of this invention is suitable for use with all such types of sensors. The output of sensor 12 on line 14 is shown as being provided to the Sensor Using Circuitry 16 which may simply be a recorder or a meter for visual observation of the fluctuations of the system parameter being monitored. The output of sensor 12 is also provided to the sensor response Time Degradation Monitor 18 of this invention. Thus, the Sensor Response Time Degradation Monitor Circuitry 18 may be considered separately from Sensor Using Circuitry 16. The sensor output on line 14 is received by the Sensor Response Time Degradation Monitor Circuitry 18 of this invention at Bandpass Filter 20. Bandpass Filter 20 removes the low frequencies, such as for example frequencies of 0.001 Hz to 0.1 Hz and below as well as, of course, the DC components of a signal. In addition, Bandpass Filter 20 is selected to eliminate the effects of extraneous electrical signals having a higher frequency. For example, Bandpass Filter 20 will eliminate frequencies above a selected frequency such as 1 Hz or 30 Hz. Thus, it will be appreciated that 60 Hz electrical noise will be eliminated. It will also be appreciated, of course, that the high frequency selected and the low frequency selected for Bandpass Filter 20 is determined by the specific type of the sensor and its output. For purposes of explanation and to aid in the understanding of this invention, there is shown at FIG. 3 a graph representing the actual variations of a process parameter such as, for example, temperature, pressure, etc. According to this graph the process crosses the average or "zero" level nine times as is indicated by arrows 23. FIG. 4 illustrates a theoretical filter output as might be provided on line 22 through Bandpass Filter 20 from a perfect sensor having a zero time constant or instantaneous response. The graph of FIG. 4 is substantially identical to the graph of FIG. 3, and also crosses the average or zero level nine times as indicated by arrows 23. Referring now to FIGS. 3 and 4, it can be assumed that a random signal of approximately 10 Hz is illustrated. It should be understood, however, that the frequency of the illustrated output of FIG. 3 was not intended to be a steady periodic signal or is it in any way limited to a frequency of around 10 Hz since the frequency of the random signal could vary significantly, such as, for example, between 5 and 20 Hz. As can be seen from FIG. 3, the illustrated output is shown as varying around a zero voltage level. It will be appreciated, however, that the signal might well have varied around a positive or negative average voltage level of say 5 volts and also could have included a high frequency component such as 60 cycle electrical noise.

Figure 5:
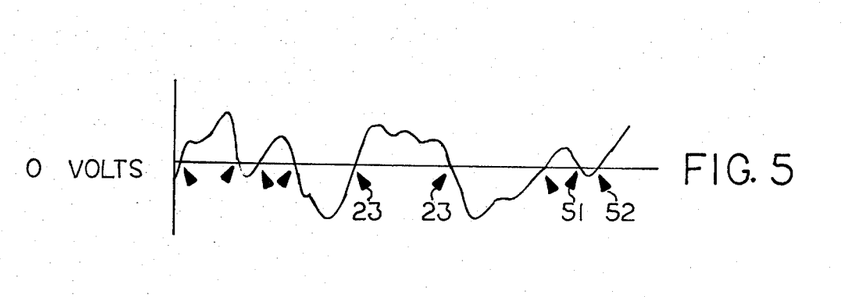
FIGS. 5 and 6 are graphs illustrating the fluctuations of a system or process parameter as sensed by a typical sensor having different time constants. The graph of FIG. 5 having a faster time constant than that of FIG. 6.
Figure 6:
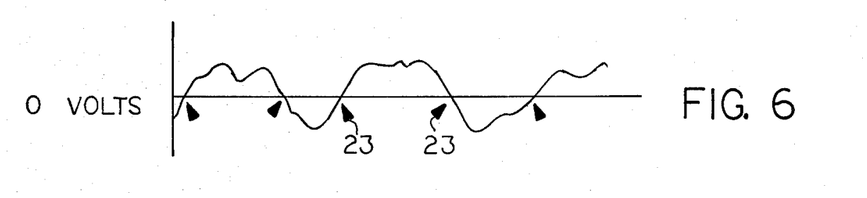
Figure 7:
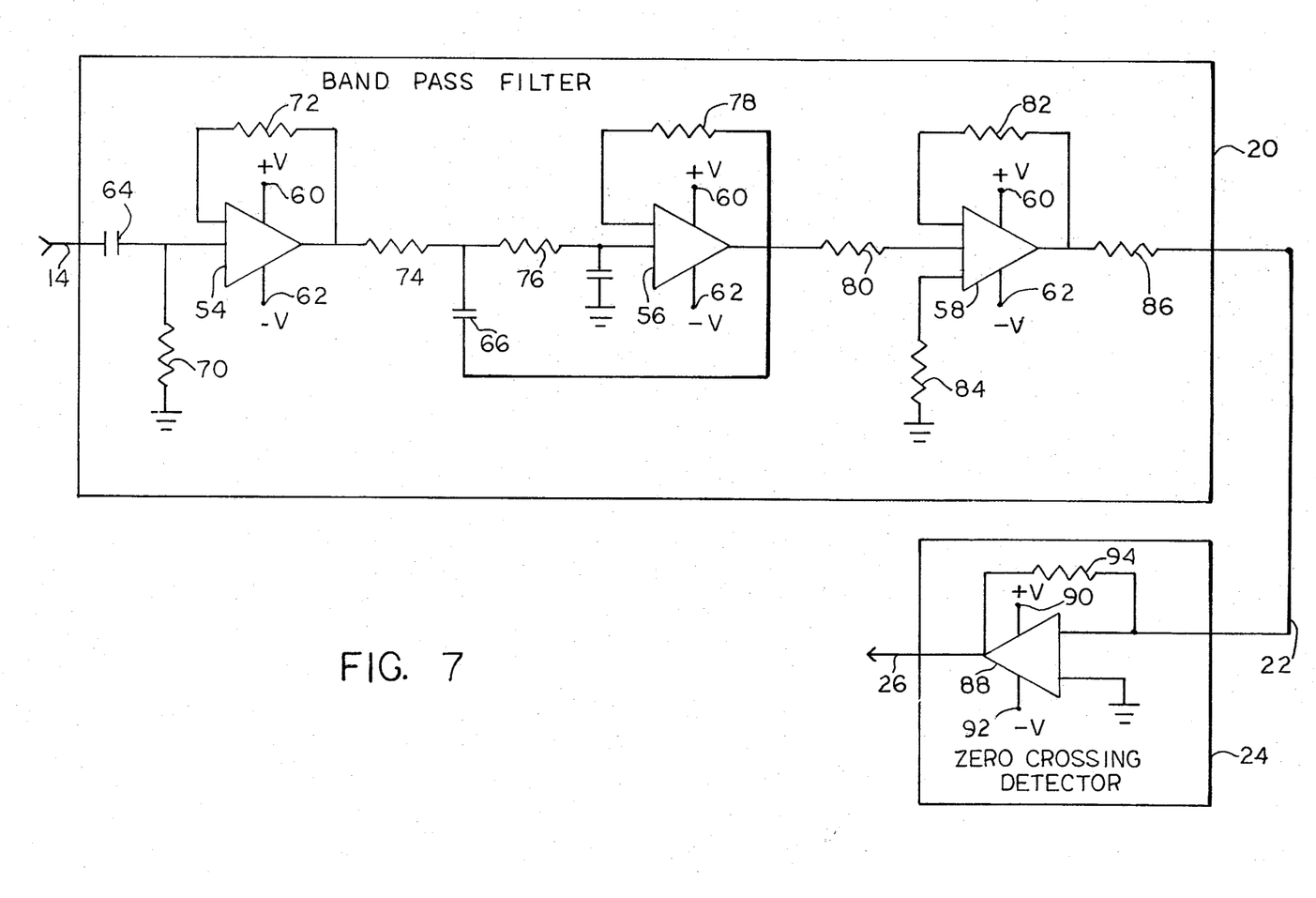
FIG. 7 is a circuit diagram of a specific embodiment of the present invention.

It is understood, of course, that such a perfect sensor as illustrated in FIG. 4 does not exist and in actuality the response time of the sensor may be substantially slower than instantaneous. FIGS. 5 and 6 which will be discussed in detail hereinafter show a more realistic or typical sensor output signal which has passed through Bandpass Filter 20 such that the low frequency (including DC) and high frequency components have been removed.

As will be discussed in detail, hereinafter, FIGS. 5 and 6, which are provided for explanation purposes only, represent the output signal of a typical sensor 12 on line 22. The time constant of the sensor illustrated by the graph of FIG. 5 was selected to be "fast" such as, for example, on the order of a few hundred milliseconds, whereas the time constant of the sensor illustrated by the graph of FIG. 6 was selected to be slow, as, for example, on the order of a few seconds.

Figure 2:
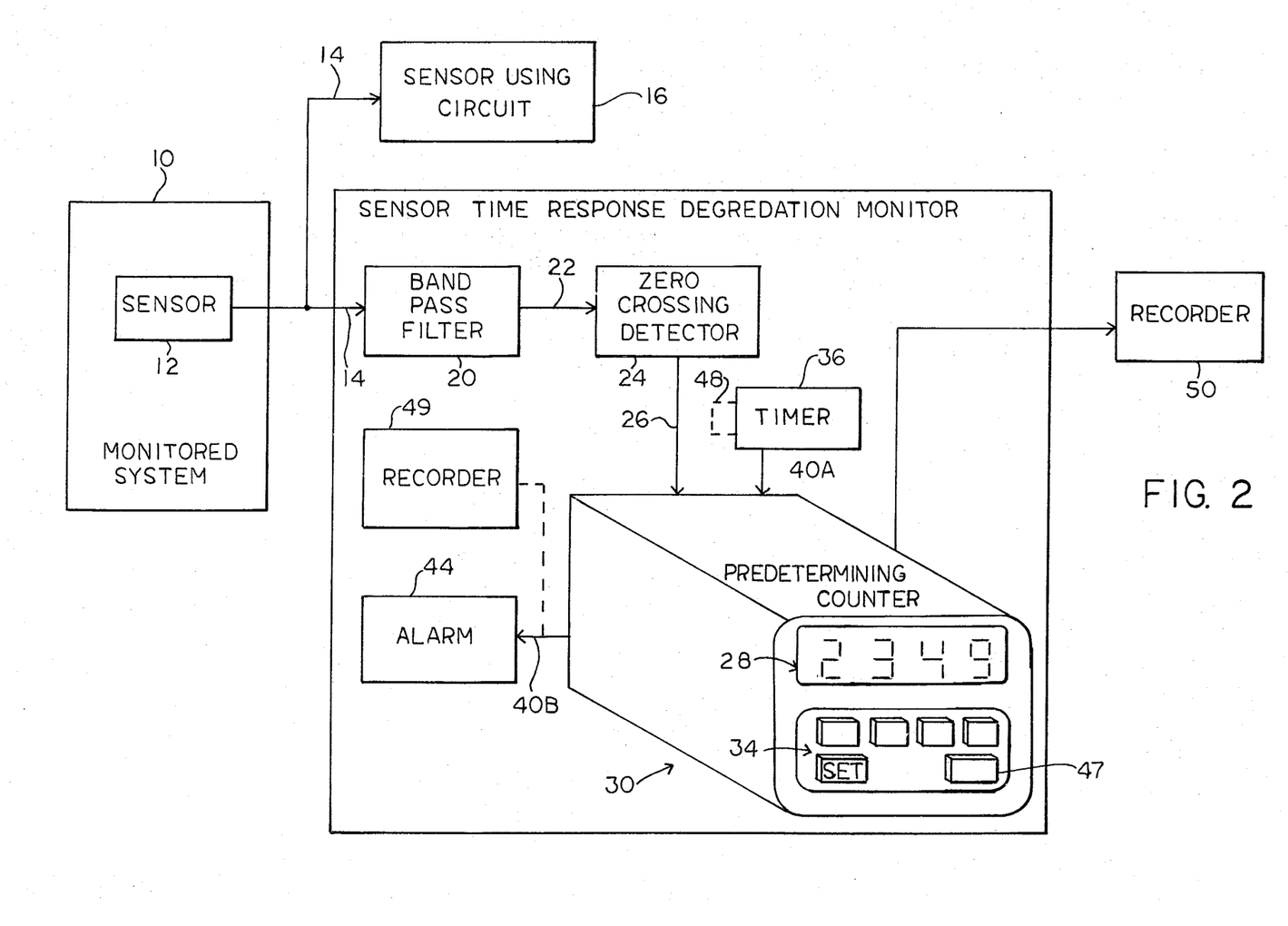
FIG. 2 is a part pictorial and part schematic drawing of an alternate embodiment of the time degradation monitor of the present invention.

The output of Bandpass Filter 20 on line 22 is provided to Detector 24 on line 22. Detector 24 provides an indication at output 26 each time the signal input on line 22 crosses a preselected reference level such as, for example, a predetermined average signal level which will be referred to hereinafter as the zero level. This output on line 26 is then provided to a Monitor Circuitry 28. It will be appreciated, that the Monitor Circuitry 28 may be a counter, or a register but in either event it is preferably recorded such that a continuous monitoring of the zero crossing rate per a selected time period can be evaluated. Further, as will be discussed below, monitor 28 could simply be the read-out on a counter used in the Rate Comparison Circuitry 30. In addition to the output provided to Monitor Circuitry 28, the present embodiment also illustrates that the Detector 24 (hereinafter referred to as Zero-Crossing Detector) output is also provided to Rate Comparison Circuitry 30 for comparing the zero crossing rate as detected by Zero-Crossing Detector 24 with a predetermined acceptable zero crossing rate. Rate Comparison Circuitry 30 which receives the output from Zero-Crossing Detector 24 may be of any suitable type but will include a counter, means for providing an electrical signal when a selected count occurs, and a timer. According to the embodiment of FIG. 1, a selected count is set in Counter 32 by the "Count Preset" Controls 34. During operation Counter 32 continuously receives an input from Zero-Crossing Detector 24. Therefore, to start a comparison cycle, a reset/start signal is shown being received by both Counter 32 and Timer 36 on line 38. The output of Timer 36 on line 40 is connected to Control Switch 42 such that when a selected time period elapses a signal can be supplied through Control Switch 34 via line 40A and 40B to Alarm 44. However, Timer 36 may also provide the selected time period mentioned above with respect to Monitor Circuitry 28 by means of line 40C. However, Counter 32 is also connected to Control Switch 42 such that an output from Counter 32 on line 46, will interrupt the path between line 40A and 40B. Although the embodiment of FIG. 1 discloses discrete components such as Monitor 28, Counter 32, Preset Controls 34, and Control Switch 42, it will be appreciated that readily available units having all the above mentioned components provided as an integral unit are available. For example, the Veeder-Root Company of Hartford, Connecticut manufactures a "Minicontroller Predetermining Counter," part no. 799204-246 which is particularly suitable for use with this invention. FIG. 2 shows a part pictorial and part schematic of an embodiment similar to that of FIG. 1 employing such a predetermining counter.

Thus, referring again to FIG. 1; as Zero-Crossing Detector 24 provides a pulse on line 26 to Counter 32, Counter 32 will be incremented (or decremented if a "down" counter is used) for each zero crossing. If the number of counts received by counter 32 does not equal or exceed the preselected number selected by Preset Counter 34, before Timer 36 completes its timing cycle, the path between Timer 36 and Alarm 44 will not be interrupted, and Timer 36 will provide an output on line 40A through Control Switch 42 to line 40B and on to Alarm 44 which in turn will provide a warning. However, if Counter 32 provides a signal to Control Switch 42, the signal from Timer 36 to Alarm 42 will be interrupted and no alarm given. Control Switch 42 could be any suitable electronic or electrical switch, including a relay as is illustrated in FIG. 1 wherein line 40A and 40B between the Timer 36 and Alarm 44 are connected to the relay normally closed contacts, and line 46 from the Counter is connected to the relay coil. Typical counting durations could range from a minute to several hours depending, of course, on the type of signal being monitored.

The number of zero crossings that indicates acceptable performance and which should be set in Counter 32 may be determined by obtaining the time constant of the sensor when first installed (i.e. $\tau_{new}$). The number of zero crossings during a selected time period for the newly installed sensor is then obtained (i.e. $N_{new}$). A value for the maximum allowable time constant ($\tau_{max}$) is then selected and may be determined because of safety consideration or minimum acceptable system performance. From this information the minimum number of acceptable zero crossings $N_c$ may be determined from the following equation:

$$N_c = N_{new}(\tau_{new})/\tau_{max} \tag{1}$$

Although the operation of the Sensor Response Time Degradation Monitor of this invention as discussed above and the form of equation (1) have been demonstrated by emperical data, and may be intuitively understood, such an understanding and emperical data can be shown to be correct by the following mathematial proof which was developed by a unique combination of previously known theories. For example, the power spectral density of an output signal from a system has been shown by J. S. Thie in his publication, "Reactor Noise" by Rowman and Littlefield, Inc. New York, 1963 to be:

$$PSD_o = |G|^2 PSD_1 \tag{2}$$

where $PDS_o$ = the power spectral density of a fluctuating output signal from the system; $PSD_1$ = the power spectral density of a fluctuating input disturbance to a system; and $|G|^2$ = the square modulas of a system transfer function.

Now, since all the three quantities of equation (2) are functions of frequency, it will be appreciated that a change in $PSD_o$ would indicate a change in either $PSD_1$ or in $|G|^2$. And, since it seems appropriate to assume that $PSD_1$ is white noise and is, therefore, substantially constant at all frequencies, it will be appreciated that a measurable change in $PSD_o$ would probably indicate a change in the response characteristics of $|G|^2$. Thus, since the $PSD_o$ function can be determined from a fluctuating output signal using Fourier analysis method, it will be appreciated that if value of $|G|^2$ is known, a transfer function having a specific form can be made to fit the $PSD_o$ function by the least squares fitting method. Once the transfer function of $PSD_o$ is known, the response to any time dependent input such as a step or ramp function can also be determined. Finally, of course, by using a step response the time constant can be determined.

Now, it will be appreciated by those skilled in the art, that the system transfer function for thermocouples and resistance thermometers may be expressed as:

$$G(s) = \frac{1}{(s + p_1)(s + p_2)} \tag{3}$$

It has previously been shown by experts in the field, such as A. Papoulis in his publication, "Probability, Random Variables and Stochastic Processes," published by McGraw Hill Book Company, New York, in 1965, that the number of zero crossings N, per unit time of a random signal is given by the equation:

$$N = \frac{1}{\pi} \left[ \frac{\frac{d^2R}{d\tau^2} \tau = 0}{-R(\tau = 0)} \right]^{\frac{1}{2}} \tag{4}$$

wherein
R = autocorrelation function of the signal,
d = differential operator
t = time
$R(\tau)$ = autocorrelation function of the signal at a lag of $\tau$,
$R(0)$ = autocorrelation function of the signal at a lag of 0.

The autocorrelation function R can further be expressed according to the integral function:

$$R = \frac{1}{T} \int_{-T/2}^{T/2} 0(t)0(t + \tau)dt \tag{5}$$

wherein:
T = Time period of the sample.

According to the Thie publication previously discussed, a relation exists between the power spectral density of the signal and the autocorrelation function of that signal. Accordingly, this function may be expressed as:

$$PSD = F[R] \tag{6}$$

$$R = F^{-1}[PSD] \tag{7}$$

wherein:
F = Fourier transform operator
$F^{-1}$ = inverse Fourier transform operator Now, if we assume white noise such that the term $PSD_1$ is a constant, we can combine equations (2) and (3) to obtain the function:

$$PSD_0 = \frac{C}{(w^2 + p_1^2)(w^2 + p_2^2)} \tag{8}$$

Now, if according to equation (7) we take the inverse Fourier transform of equation (8) we obtain:

$$R(\tau) = F^{-1}[PSD_o] = \frac{C\pi}{(p_2^2 - p_1^2)} \left[ \frac{e^{-p_1|\tau|}}{p_1} - \frac{e^{-p_2|\tau|}}{p_2} \right] \tag{9}$$

Then by substituting the value of $R(\tau)$ into the equation (4), simplifying and reducing terms we obtain the equation:

$$N = \frac{(p_1 p_2)^{\frac{1}{2}}}{\pi} \tag{10}$$

Since $p_1$ and $p_2$ are reciprocals of time constants, equation (10) may be rewritten as:

$$N = \frac{1}{\pi(\tau_1\tau_2)^{\frac{1}{2}}} \qquad (11)$$

Equation (11) itself can in turn be rewritten in the form:

$$(\tau_1\tau_2)^{\frac{1}{2}} = 1/\pi N \qquad (12)$$

It can be shown that $\tau_2 = (1/\alpha)\tau_1$ when $\alpha$ is greater than 1, and therefore we can obtain:

$$\tau_1 = \frac{\sqrt{\alpha}}{\pi N}, \qquad (13)$$

and $$\tau_2 = \frac{1}{\sqrt{\alpha}} \frac{1}{\pi N} \qquad (14)$$

Thus, since $$\tau \cong \tau_1 + \tau_2, \qquad (15)$$

it will be appreciated that:

$$\tau \cong \frac{1}{\pi N}\left(\frac{\alpha+1}{\sqrt{\alpha}}\right) \qquad (16)$$

Inspection of equation (16) quickly reveals that the zero crossing rate for a typical temperature sensor is approximately inversely related to the sensor time constant. Also, it should be appreciated that even though some assumptions were made and that the relationship of equation (16) is not exact, it is certainly believed to be exact enough to show that an N-fold increase in the sensor time constant will cause approximately an N-fold decrease in the zero crossing rate.

Thus, in addition to emperical data which shows that a decrease in the number of zero crossings is indicative of the sensor response time degradation there has been shown by the above discussed proof, a mathematical or theoretical bases of the operation of the response time degradation monitor. Finally, although the example of the mathematical proof was with respect to a thermocouple and resistance thermometer sensor which have a simple transfer function, it is believed that this proof is sufficient to show that a similar proof would be available for sensors having mechanical linkages that include energy storing components such as springs, and which consequently would require a second order transfer function with complex poles.

It will also be appreciated that Rate Comparison Circuitry 30 was described with respect to a particular embodiment. However, Rate Comparison Circuitry 30 could include any type of circuitry or arrangement of components which would have the overall effect of comparing the present zero crossing rate with a predetermined acceptable zero crossing rate. Also, of course, the Timer 36 could be of two types, one which runs for a selected duration and then stops until reset such as is indicated by Switch 47 or Timer 36 could run for a selected duration and then reset itself as is indicated by dashed line 48. It will also be appreciated that Counter 32 could be an electro-mechanical counter for sensors having a slow zero crossing rate, when an electronic counter might be necessary for sensors having a high zero crossing rate.

Alarm 44 could actually be an audible alarm, some visual indicator such as a flashing red light, or nothing more than a readout on a recorder. However, it will be appreciated that the purpose of the Alarm 44 is to indicate to the operator of a system that the number of zero-crossings of the monitored signal has decreased below the level that indicates an acceptable sensor time constant.

Also shown are Recorders 49 and 50 which could be connected to Monitor Circuitry 28 or Rate Comparison Circuitry 30 for providing a permanent and continuous record of the zero crossing rate and excessive degradation of the time constant of the sensor.

Referring again to FIGS. 3 and 4, it can be seen that the number of actual zero crossings of the system fluctuations after being filtered by Bandpass Filter 20, and as would be sensed by the perfect sensor having zero response time would be approximately 9. However, as was mentioned heretofore, such perfect sensors are not available and in fact are not necessary. FIG. 5 shows the output of a "fast" sensor which would monitor system fluctuations of the type shown in FIG. 3. Thus, there is illustrated in FIG. 5 the approximate representation of the signal of FIG. 3 around a zero level by a sensor having a time constant on the order of a few hundred milliseconds. As can be seen from FIG. 5, a sensor of this type will result in a different shaped graph than that of the theoretical signal of FIG. 3. In the graph of FIG. 5, there are still nine zero-crossings, however, it will be noted that the curve is somewhat smoother and just barely crosses the zero level at arrows 51 and 52. It should also be appreciated that even a "fast" sensor may eventually miss one or more zero crossings. Now referring to FIG. 6, there is shown a graph of a sensor similar to that discussed with respect to FIG. 5 except that the response time has been substantially increased above the response time of the graph shown in FIG. 5, such as for example, to several seconds. In this graph, it can be seen that the curve is even smoother than the curve of FIG. 5, and that the number of zero crossings has decreased to only five. Thus, FIGS. 5 and 6 graphically illustrate that an increase in the time constant of a sensor will result in the decrease in the number of zero crossings. It is this relationship between the number of zero crossings and the increase in time constants that provides a basis for the unique method and apparatus of this system. That is, the Sensor Response Time Degradation Monitor of this invention exploits the dependancy and the statistical properties of the sensor output with respect to its response characteristics. This is because, the normal fluctuations that occur in a process or the operation of the system cause fluctuations in the output of the sensors that monitor these variables. Fast sensors, of course, respond more exactly to these process variables than do slow sensors. Thus, if the monitored parameter variable crosses an average value 10 times per second, then the output of a perfect sensor (i.e. one having a response time of zero) also crosses the average value 10 times per second. However, it will be appreciated those skilled in the art that all sensors have a finite response time such that they cannot follow the process variables exactly and, therefore, there will always be a lag. As a result, some of the crossings of the average value will not be observed by the sensor. Furthermore, the number of crossings monitored by the sensor will decrease continuously as the sensor response time increases. A faster sensor will track fluctuations in a monitored parameter better than a slower sensor, and a faster sensor will pass through its average value more frequently than a slower sensor.

Referring now to FIG. 5, there is shown a specific embodiment of a Bandpass Filter 20 and Zero Crossing Detector 24 suitable for use with the present invention. According to this embodiment, Bandpass Filter 20 was designed to have a low frequency cut-off value of around 4 Hz. Operation amplifiers 54 and 56 have a standard identifying number 356. Operational Amplifier 58 has a standard identifying number 741. Capacitors 64, 66, and 68 have values of 4, 0.22 and 0.22 micro farads respectively. Resistors 70, 72, 74, 76, 78, 80, 82, 84 and 86 have values of 1.2 meg-ohms, 1.2 meg-ohms 200 kilo-ohms, 200 kilo-ohms, 360 kilo-ohms, 1 kilo-ohm, 10 kilo-ohms, 900 ohms and 5.1 kilo-ohms, respectively.

Zero-Crossing Detector 24 includes a comparator identified as number 339. Feed-Back Resistor 94 is a 1 meg-ohm resistor.

Thus, although the present invention has been described with respect to specific methods and apparatus for monitoring degradation of the response time of a sensor, it is not intended that such specific references be considered as limitation on the scope of this invention except insofar as is set forth in the following claims.

What is claimed is:

1. A method for monitoring changes in the response time of a sensor while said sensor monitors fluctuations in a selected perameter comprising the steps of:
   providing a sensor signal from said sensor being monitored, said sensor signal indicative of fluctuations of said selected parameter;
   receiving said sensor signal and monitoring when the value of said sensor signal crosses a selected signal level;
   determining the number of times said sensor signal crosses said selected level in a selected time period to obtain a crossing rate; and
   comparing said crossing rate with a nominal crossing rate of determine a change in the response time of said monitored sensor.

2. The method of claim 1 wherein said selected signal crossing level is the average value of the sensor signal.

3. The method of claim 1 wherein an increase in the response time of said monitored signal is determined, and said nominal crossing rate is a preselected minimum acceptable rate.

4. The method of claim 1, 2 or 3 and further comprising the step of filtering any DC component and those high frequency components from said sensor signal not indicative of fluctuations of said parameter.

5. The method of claim 1, 2 or 3 and further comprising providing an indication when said change in said sensor is greater than said preselected acceptable rate.

6. The method of claim 1, 2, or 3 and further comprising the step of recording said comparison between said crossing rate and said nominal crossing rate.

7. The method of claim 1 wherein said selected crossing signal level is the average value of said sensor signal, and wherein said comparing step includes comparing the detected crossing rate with a preselected acceptable minimum rate to determine whether or not said response time has increased, and further comprising the step of filtering DC components and high frequency components from said sensor signal if said high frequency components are not indicative of fluctuations of said parameter.

8. The method of claim 7 and further comprising the step of providing an indication when said change in said response time is greater than a predetermined acceptable value.

9. Circuitry for monitoring the changes in the response time of a sensor while said sensor monitors fluctuations in a selected parameter comprising:
   a sensor having a selected response time and for producing a sensor signal indicative of fluctuations of a selected parameter;
   means for receiving said sensor signal indicative of fluctuations of said selected parameter and for indicating when the value of said sensor signal crosses a selected signal level;
   means for determining the number of times said sensor signal crosses said selected level in a selected time period to obtain a crossing rate; and
   means for comparing said crossing rate with a nominal crossing rate to determine a change in said selected response time of said monitored sensor.

10. The circuitry of claim 9 wherein said means for receiving is a zero-crossing detector.

11. The circuitry of claim 9 wherein said means for determining is a signal counter in combination with a timer.

12. The apparatus of claim 11 wherein said timer resets said counter on a periodic basis.

13. The circuitry of claim 9, 10 or 11 further comprising a filter for removing any DC component, and any high frequency not indicative of the fluctuations of said parameter prior to said sensor signal being applied to said means for receiving.

14. The circuitry of claim 9, 10 or 11 and further comprising means for indicating when said change in said response time is greater than a preselected acceptable rate.

15. The circuitry of claim 9, 10 or 11 and further comprising means for recording said comparison between said crossing rate and said nominal crossing rate.

16. The apparatus of claim 9 wherein said means for receiving and indicating is a zero crossing detector and wherein said detection means is a signal counter in combination with a timer and further comprising means for filtering the DC component and high frequency components from said sensor signal when said high frequency components are not indicative of fluctuations of said parameter.

17. The circuitry of claim 16 and further comprising means for recording said comparing of said crossing rate with said nominal crossing rate.

18. Circuitry for online monitoring of the degradation of the response time of a sensor while said sensor monitors fluctuations of a selected parameter of the system comprising:
   a sensor having a selected response time and for producing a sensor signal indicative of fluctuations of a selected parameter;
   a Zero-Crossing Detector for receiving said sensor signal indicative of fluctuations of said selected parameter and for providing a first signal each time said sensor signal passes through the average value of said sensor signal;
   a counter to receive said first signals, to accumulate the number of said first signals received, and to provide a second signal when said accumulated number reaches a preselected value;

a timer for providing a third signal after a preselected period of time has elapsed; and a control switch connected to said counter and said timer, and control switch for providing a fourth signal, which fourth signal is indicative of excessive degradation of said selected response time of said sensor, when said third signal is provided to said control switch before said second signal.

19. The circuitry of claim 18 and further comprising a filter for removing any DC component and any high frequency components not indicative of fluctuation of said parameter from said sensor signal, prior to said signal being received by said Zero-Crossing Detector.

20. The circuitry of claim 18 and further comprising an alarm responsive to said fourth signal 21. The circuitry of claim 18 wherein said counter and said control switch comprises a predetermining counter.

* * * * *